(12) United States Patent
Tsai et al.

(10) Patent No.: US 10,361,961 B2
(45) Date of Patent: Jul. 23, 2019

(54) FLOW ENTRY AGGREGATION METHOD AND RELATED NETWORK SYSTEM

(71) Applicants: Inventec (Pudong) Technology Corp., Shanghai (CN); Inventec Corporation, Taipei (TW)

(72) Inventors: Tsung-Hsien Tsai, Taibei (TW); Kuo-Chen Wang, Taibei (TW); Wei-Feng Wu, Taibei (TW); Wei-Tso Tsai, Taibei (TW); Yu-Han Shih, Taibei (TW)

(73) Assignees: Inventec (Pudong) Technology Corp., Shanghai (CN); Inventec Corporation, Taipei (TW)

( * ) Notice: Subject to any disclaimer, the term of this patent is extended or adjusted under 35 U.S.C. 154(b) by 53 days.

(21) Appl. No.: 15/743,280

(22) PCT Filed: Mar. 25, 2016

(86) PCT No.: PCT/CN2016/077345
§ 371 (c)(1),
(2) Date: Jan. 10, 2018

(87) PCT Pub. No.: WO2017/088330
PCT Pub. Date: Jun. 1, 2017

(65) Prior Publication Data
US 2018/0198719 A1    Jul. 12, 2018

(30) Foreign Application Priority Data
Nov. 25, 2015 (CN) .......................... 2015 1 0831132

(51) Int. Cl.
*H04L 12/851* (2013.01)
*H04L 29/06* (2006.01)
*H04L 12/811* (2013.01)
*H04L 12/721* (2013.01)
*H04L 12/725* (2013.01)
(Continued)

(52) U.S. Cl.
CPC ...... *H04L 47/2441* (2013.01); *H03M 7/3059* (2013.01); *H03M 13/6588* (2013.01); *H04L 29/0604* (2013.01); *H04L 45/02* (2013.01); *H04L 45/306* (2013.01); *H04L 45/34* (2013.01); *H04L 45/38* (2013.01); *H04L 47/38* (2013.01);
(Continued)

(58) Field of Classification Search
CPC ... H04L 43/026; H04L 47/2441; H04L 47/38; H04L 65/80; H04L 69/04; H04L 45/02; H04L 45/38; H04L 45/64; H04L 29/0604; H03M 7/3059; H03M 13/6588
See application file for complete search history.

(56) References Cited

U.S. PATENT DOCUMENTS

| | | | | |
|---|---|---|---|---|
| 2015/0092778 A1* | 4/2015 | Jackson | .............. | H04L 67/2842 370/392 |
| 2015/0131666 A1* | 5/2015 | Kang | .................... | H04L 45/745 370/392 |
| 2015/0304212 A1* | 10/2015 | Zhou | ................... | H04L 45/7457 370/392 |

* cited by examiner

*Primary Examiner* — Mewale A Ambaye
(74) *Attorney, Agent, or Firm* — Winston Hsu (57) ABSTRACT

A flow entry aggregation method of a network system includes classifying a plurality of flow entries into a plurality of partitions according to a plurality of indicators of the plurality of flow entries, wherein each flow entry utilizes ternary strings to represent at least one field of the flow entry and the plurality of indicators are utilized to indicating network requirements corresponding to the plurality of flow entries; and utilizing bit merging or subset merging to compress the flow entries in the same partition.

10 Claims, 6 Drawing Sheets

(51) Int. Cl.
  *H04L 12/751* (2013.01)
  *H03M 7/30* (2006.01)
  *H03M 13/00* (2006.01)
  *H04L 12/26* (2006.01)
(52) U.S. Cl.
  CPC ............ *H04L 69/04* (2013.01); *H04L 43/026* (2013.01); *H04L 65/80* (2013.01)

FLOW ENTRY AGGREGATION METHOD AND RELATED NETWORK SYSTEM

BACKGROUND OF THE INVENTION

1. Field of the Invention

The present invention relates to a flow entry aggregation method and related network system, and more particularly, to a flow entry aggregation method of reducing the number of flow entries stored in switches in a network system and related network system.

2. Description of the Prior Art

The network enters a new level after software-defined networking (SDN) appears. Functions that are difficult to be realized can be implemented by utilizing the SDN. For example, the SDN is able to utilize programmable network control layers to realize an application-aware routing function. The application-aware routing function allocates most suitable network route to each application according to features of each application, so as to utilize limited network resource to fulfill quality-of-service (QoS) requirements of each application. However, the application-aware routing function would significantly increases the number of flow entries stored in switches of a network system, resulting in that the number of flow entries stored in switches may exceed the storage capacity of the switches. Thus, how to reduce the number of flow entries required to be stored in the switches becomes a topic to be discussed.

SUMMARY OF THE INVENTION

In order to solve the above issue, the present invention provides a flow entry aggregation method of reducing the number of flow entries stored in switches in a network system and related network system.

In an aspect, the present invention discloses a flow entry aggregation method of a network system. The flow entry aggregation method comprises classifying a plurality of flow entries into a plurality of partitions according to a plurality of indicators of the plurality of flow entries, wherein each flow entry utilizes ternary strings to represent at least one field of the flow entry and the plurality of indicators are utilized to indicating network requirements corresponding to the plurality of flow entries; and utilizing bit merging or subset merging to compress the flow entries in the same partition.

In another aspect, the present invention discloses a network system. The network system comprises a plurality of hosts; and a plurality of switches, coupled among the plurality of hosts and a core network, wherein each switch stores a plurality of flow entries and each flow entry utilizes ternary strings to represent at least one field of the flow entry; wherein a first switch of the plurality of switches classifies the plurality of flow entries store in the first switch into a plurality of partitions according to a plurality of indicators of the plurality of flow entries stored in the first switch and utilizes bit merging or subset merging to compress the flow entries in the same partition of the first switch; wherein the plurality of indicators are utilized to indicating network requirements corresponding to the plurality of flow entries.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should not be interpreted as a close-ended term such as "consist of". Also, the term "couple" is intended to mean either an indirect or direct electrical connection. Accordingly, if one device is coupled to another device, that connection may be through a direct electrical connection, or through an indirect electrical connection via other devices and connections.

Figure 1:
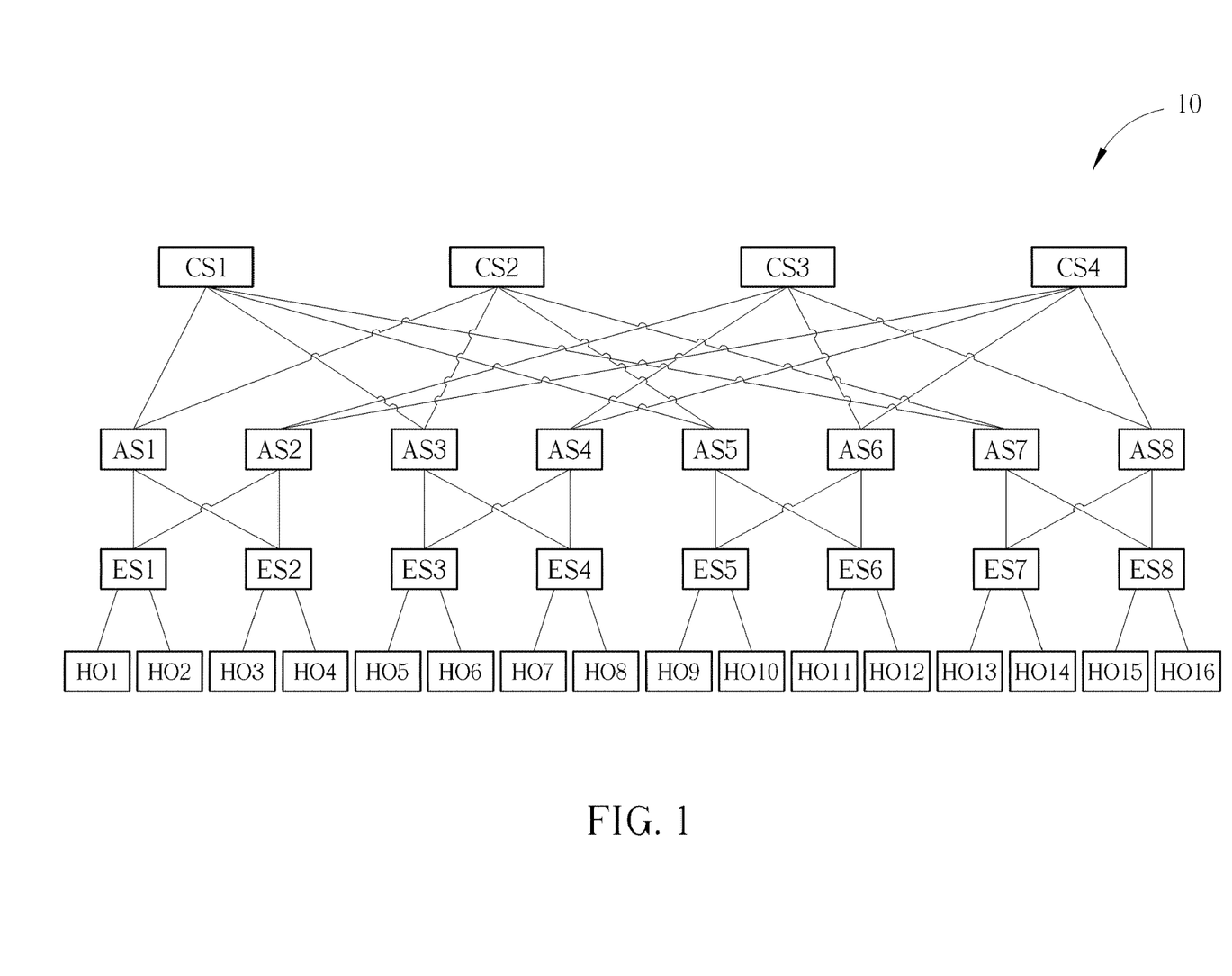
FIG. 1 is a schematic diagram of a network system according to an example of the present invention.

Please refer to FIG. 1, which is a schematic diagram of a network system 10 according to an example of the present invention. The network system 10 may be a software-defined networking (SDN) and comprises core switches CS1-CS4, aggregation switches AS1-AS8, edge switches (ES1-ES8) and hosts HO1-HO16. The core switches CS1-CS4 are coupled to core network (not shown in FIG. 1), wherein the core switches CS1 and CS2 are coupled to the aggregation switches AS1, AS3, AS5, and AS7 and the core switches CS3 and CS4 are coupled to the aggregation switches AS2, AS4, AS6, and AS8. The aggregation switches AS1 and AS2 are coupled to the edge switches ES1 and ES2, the aggregation switches AS3 and AS4 are coupled to the edge switches ES3 and ES4, the aggregation switches AS5 and AS6 are coupled to the edge switches ES5 and ES6, and the aggregation switches AS7 and AS8 are coupled to the edge switches ES7 and ES8. The edge switches ES1-ES8 are separately coupled to two of the hosts HO1-HO16. The hosts HO1-HO16 may be user terminal devices such as personal computers, laptops, and servers, and are not limited herein.

Figure 2:
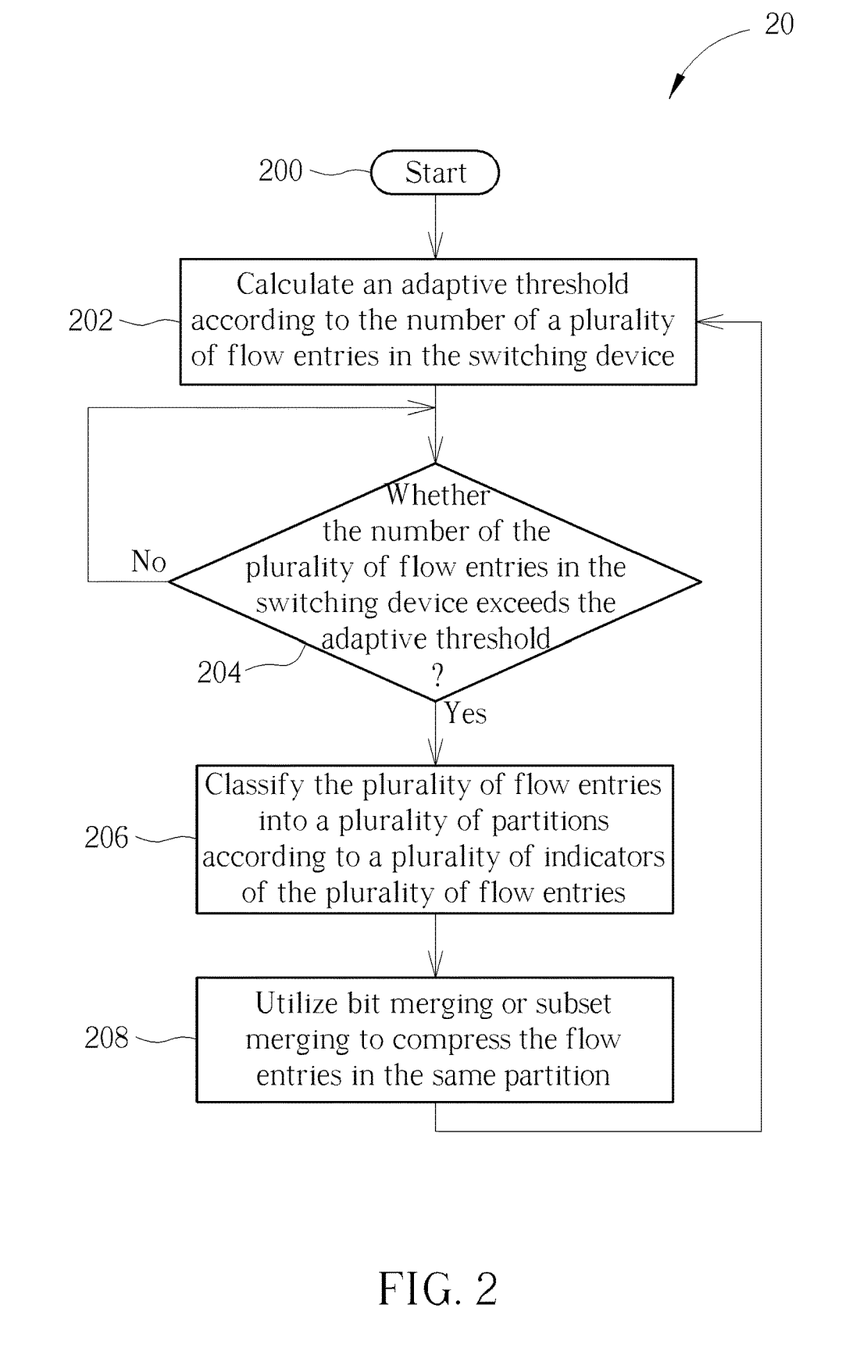
FIG. 2 is a flow chart of a flow entry aggregation method according to an example of the present invention.

Please refer to FIG. 2, which is a flow chart of a flow entry aggregation method 20 according to an example of the present invention. The flow entry aggregation method 20 may be utilized in a switching device of a network system (e.g. at least one of the core switches CS1-CS4, the aggregation switches AS1-AS8, or the edge switches ES1-ES8 of the network system 10 shown in FIG. 1) for compressing flow entries of indicating packet network paths in the switching device. In an example, the flow entry aggregation method 20 is utilized in the core switches CS1-CS4 of the network system 10 shown in FIG. 1. As shown in FIG. 2, the flow entry aggregation method 20 comprises the following steps:

Step 200: Start.

Step 202: Calculate an adaptive threshold according to the number of a plurality of flow entries in the switching device.

Step 204: Determine whether the number of the plurality of flow entries in the switching device exceeds the adaptive threshold. Perform step 206 when the number of the plurality of flow entries exceeds the adaptive threshold; otherwise, perform step 204.

Step 206: Classify the plurality of flow entries into a plurality of partitions according to a plurality of indicators of the plurality of flow entries.

Step 208: Utilize bit merging or subset merging to compress the flow entries in the same partition.

According to the flow entry aggregation method 20, the switching device calculates an adaptive threshold according to the number of flow entries stored in the switching device. In this example, each flow entry utilizes ternary strings to represent at least one field of the flow entry and is utilized to indicate rules of network paths of specific packets in the network system. In an example, the flow entries stored in the switching device occupy X % (positively proportional to the number of flow entries) of overall storage of the switching device and the equation of calculating the adaptive threshold can be expressed as:

$$\text{Adaptive threshold}=X\%+\alpha*(100-X)\% \qquad (1)$$

Wherein, $\alpha$ is a target percentage of remaining storage (the storage able to store flow entries) in the switching device and can be altered according to different applications and design concepts. Next, the switching device determines whether to perform a compression progress to reduce the number of flow entries by determining whether the number of stored flow entries exceeds the calculated adaptive threshold. When the number of the stored flow entries does not exceed the adaptive threshold, the remaining storage able to store the flow entries in the switching device is sufficient and switching device does not perform the compression progress; and when the number of the stored flow entries exceeds the adaptive threshold, the switching device starts performing the compression progress. As can be seen from equation (1), the adaptive threshold varies with the remaining storage of the switching device. That is, the switching device uses the number of flow entries able to be stored in the switching device as a reference of performing the compression progress, so as to acquire better compression rate.

When the compression progress begins, the switching device classifies the flow entries into a plurality of partitions according to an indicator of each flow entry. The indicators are utilized to indicating network requirements corresponding to the flow entries and different indicators are corresponding to applications of different requirements. For example, the flow entries with the indicator "1" may be the rules of applications whose network requirements are low delay time and low packet lose rate (e.g. voice over internet phone (VoIP), video communication or interactive game applications); the flow entries with the indicator "2" may be the rules of applications whose network requirements are low delay time variation and low packet lose rate (e.g. video streaming, network television, or website viewing); and the flow entries with the indicator "3" may be the rules of applications whose network requirements are low packet lose rate (e.g. point to point document transmission or uploading/downloading of other types of transmission). In this example, the switching device classifies the flow entries with the same indicator into the same partition.

Next, the switching device utilizes bit merging or subset merging to compress the flow entries in the same partition. When performing the bit merging, the switching device compares differences among the flow entries in the same partition. When the hamming distance between a first flow entry and a second flow entry in the same partition equals 1 (i.e. the number of positions at which symbols are different in the strings of the first flow entry and the second flow entry is 1), the switching device uses a substitution bit (e.g. "*") to substitute the symbol at the position whose symbols are different in the first flow entry and the second flow entry, to generate a third flow entry. The switching device uses the third flow entry to replace the first flow entry and the second flow entry. As a result, the number of the flow entries in the switching device is reduced.

When a fourth flow entry cannot be compressed by the bit merging (i.e. the hamming distance between the fourth flow entry and each of other flow entries in the same partition exceeds 1), the switching device performs the subset merging to try to merge the fourth flow entry. When performing the subset merging, the switching device compares the fourth flow entry with other flow entries in the same partition to determine whether the fourth flow entry is a subset of one of other flow entries in the same partition. When the fourth flow entry is the subset of a fifth flow entry (i.e. the fifth flow entry is a superset of the fourth flow entry), the switching device determines that the fifth flow entry is able to represent the fourth flow entry and utilizes the fifth flow entry to represent the fourth flow entry. By performing the subset merging, the switching device further reduces the number of flow entries.

After performing the bit merging or the subset merging to compress the flow entries of the switching device, the switching device calculates the adaptive threshold according to the number of compressed flow entries again (back to step 202). That is, the switching device adjusts the adaptive threshold according to the number of compressed flow entries after finishing the compression progress. The switching device continuously monitors the storage ratio occupied by the flow entries and performs the compression progress when the storage ratio occupied by the flow entries exceeds the adaptive threshold once again. Via adopting the adaptive threshold as the reference of performing the compression progress, a compression rate of the flow entries in the switching device is improved. Furthermore, the switching device avoids performing unnecessary compression progresses and the number of times of performing the compression progresses is reduced.

Figure 3A:
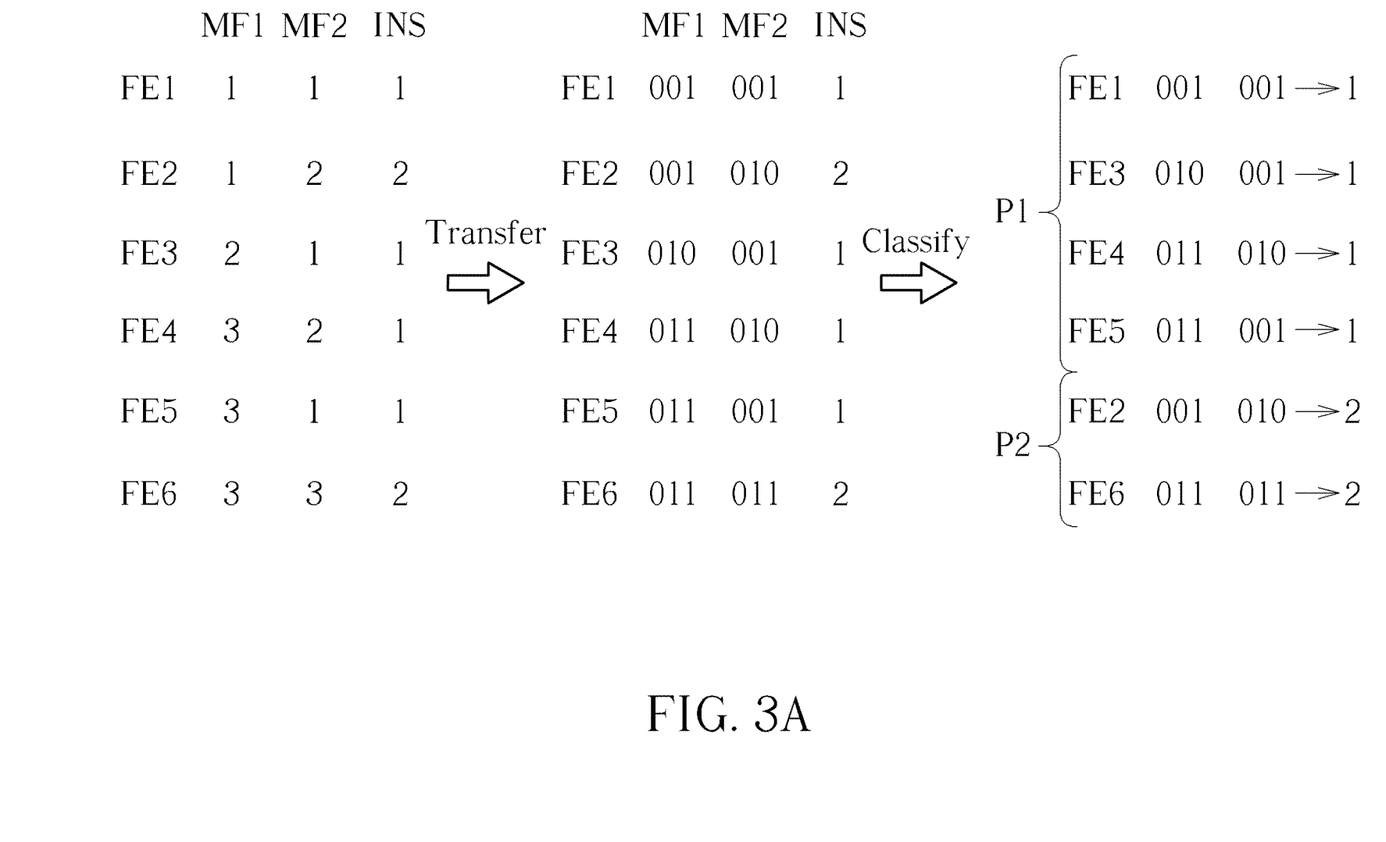
FIGS. 3A and 3B are exemplary diagrams of operating bit merging processes according to examples of the present invention.
Figure 3B:
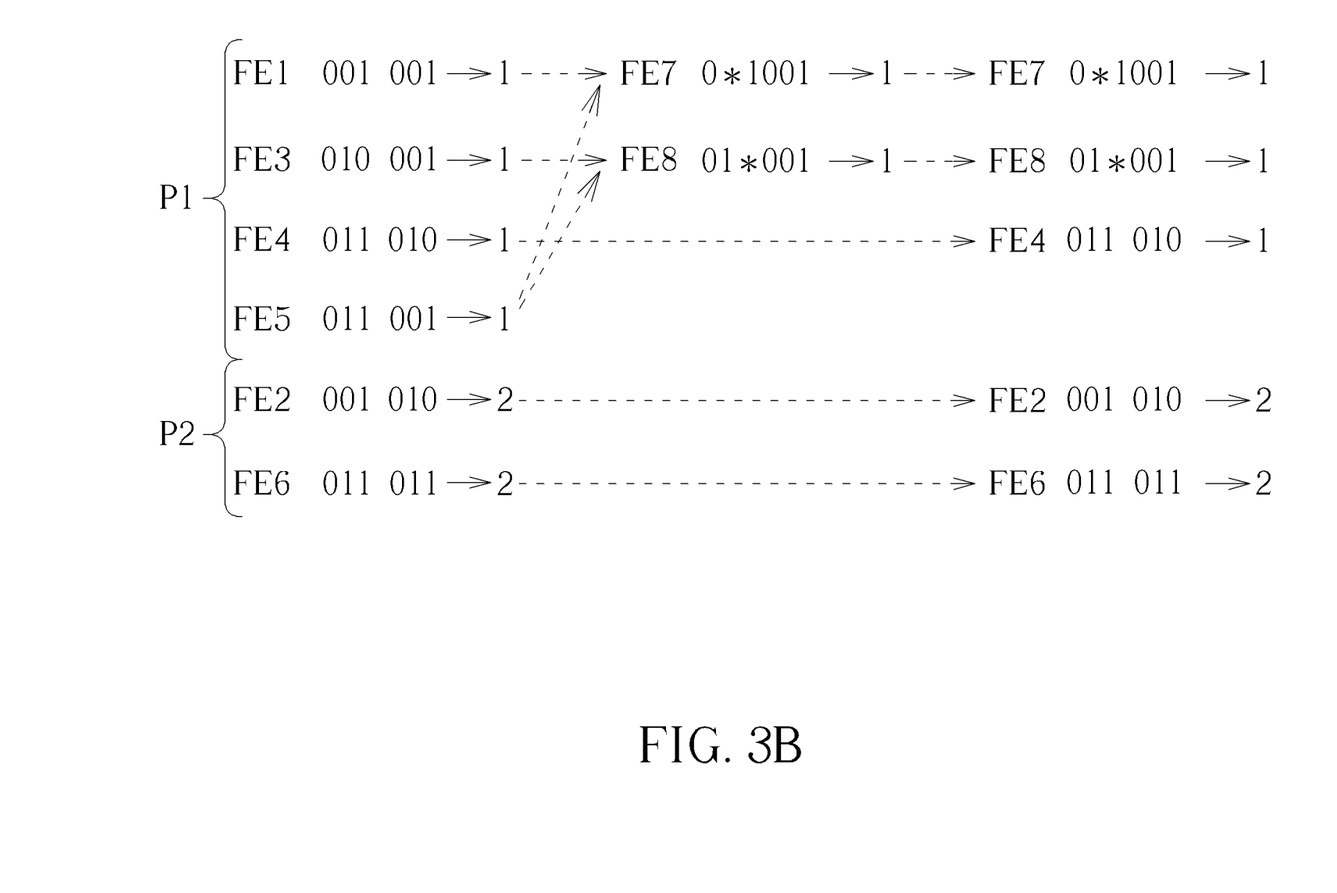

Please refer to FIGS. 3A and 3B, which are exemplary diagrams of bit merging according to an example of the present invention. As shown in FIG. 3A, the switching device comprises 6 flow entries FE1-FE6 and each of the flow entries FE1-FE6 comprises 2 fields MF1 and MF2 and an indicator INS. In an example, the field MF1 is utilized to indicate virtual local area network identification (VLAN ID) and the field MF2 is utilized to indicate input ports. According to different applications and designed concepts, the number of field in each flow entry can be appropriately altered and the information indicated by each filed may be changed. Before the bit merging begins, values in the fields MF1 and MF2 of the flow entries FE1-FE6 are not in ternary format. Thus, the switching device transfers the values in the fields MF1 and MF2 of the flow entries FE1-FE6 into ternary format before starting the bit merging. Next, the switching device classifies the flow entries FE1 and FE3-

FE5 into a partition P1 and the flow entries FE2 and FE6 into a partition P2 according to indicators INS of the flow entries FE1-FE6.

Please refer to FIG. 3B, the switching device starts compares the flow entries in the same partition after classifying the flow entries FE1-FE6 into the partitions P1 and P2 according to the indicators INS of the flow entries FE1-FE6. In this example, the hamming distance between the flow entries FE1 and FE5 is 1. The switching device uses * to substitute the second bit of the flow entries FE1 and FE5, to generate 0*1001→1 as a flow entry FE7 substituting the flow entries FE1 and FE5. Similarly, the hamming distance between the flow entries FE3 and FE5 is 1. The switching device generates 01*001→1 as a flow entry FE8 substituting the flow entries FE2 and FE5. Because the hamming distance between the flow entry FE4 and each of the flow entries FE1, FE2, and FE5 exceeds 1, the flow entry FE4 cannot be compressed by the bit merging. In addition, the hamming distance between the flow entries FE2 and FE6 in the partition P2 also exceeds 1. Thus, the flow entries FE2 and FE6 remain unchanged. By utilizing the bit merging, the switching device is able to merge the flow entries with the same indicator and whose hamming distance is 1.

Figure 4:
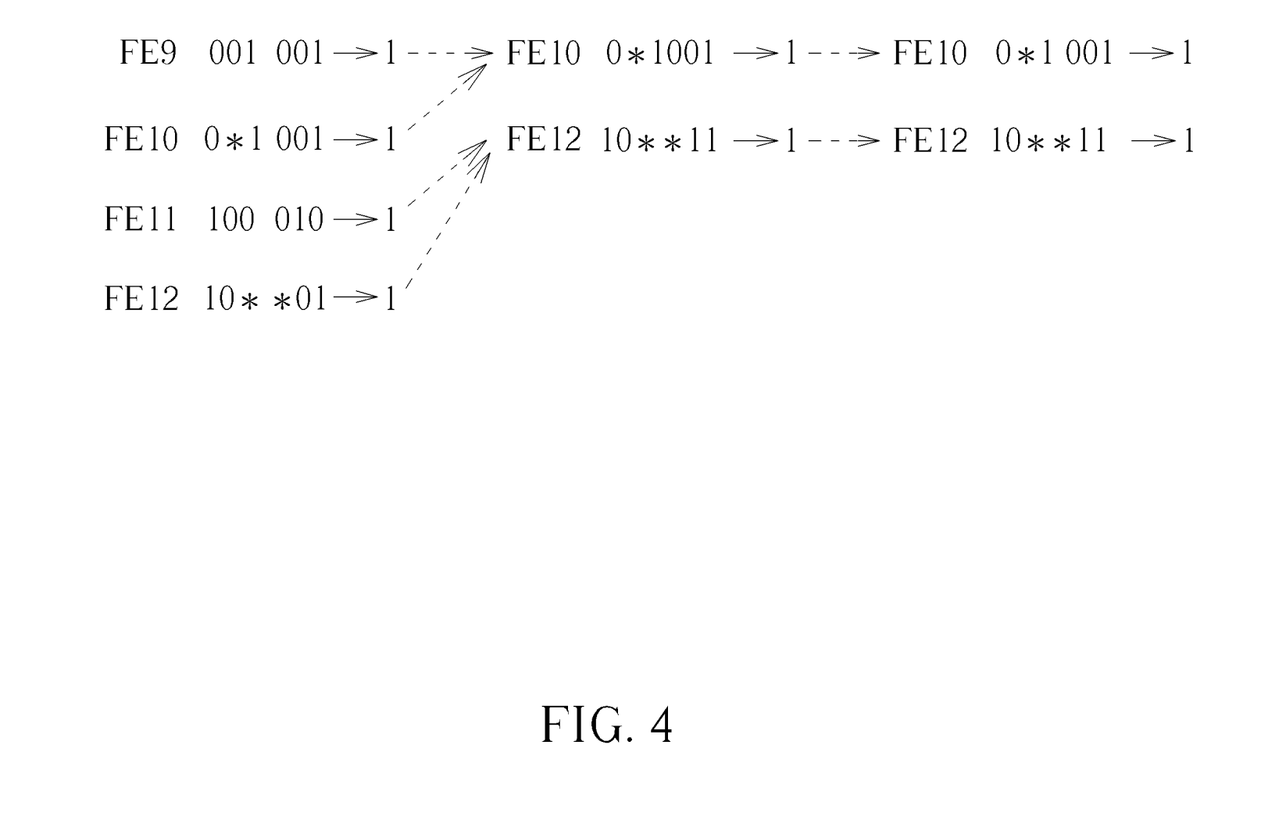
FIG. 4 is an exemplary diagram of operating subset merging processes according to examples of the present invention.

Please refer to FIG. 4, which is an exemplary diagram of subset merging according to an example of the present invention. As show in FIG. 5, the switching device comprises 4 flow entries FE9-FE12 that have the same indicator (i.e. the same partition) and cannot be merged by the bit merging. In this example, the switching device determines the flow entry FE9 is a subset of the flow entry FE10 and substitutes the flow entry FE9 by FE10. Similarly, the switching device determines the flow entry FE12 is a subset of the flow entry FE11 and substitutes the flow entry FE12 by FE11. According to the abovementioned procedures, the switching device is able to merge the flow entries of the same superset.

Figure 5:
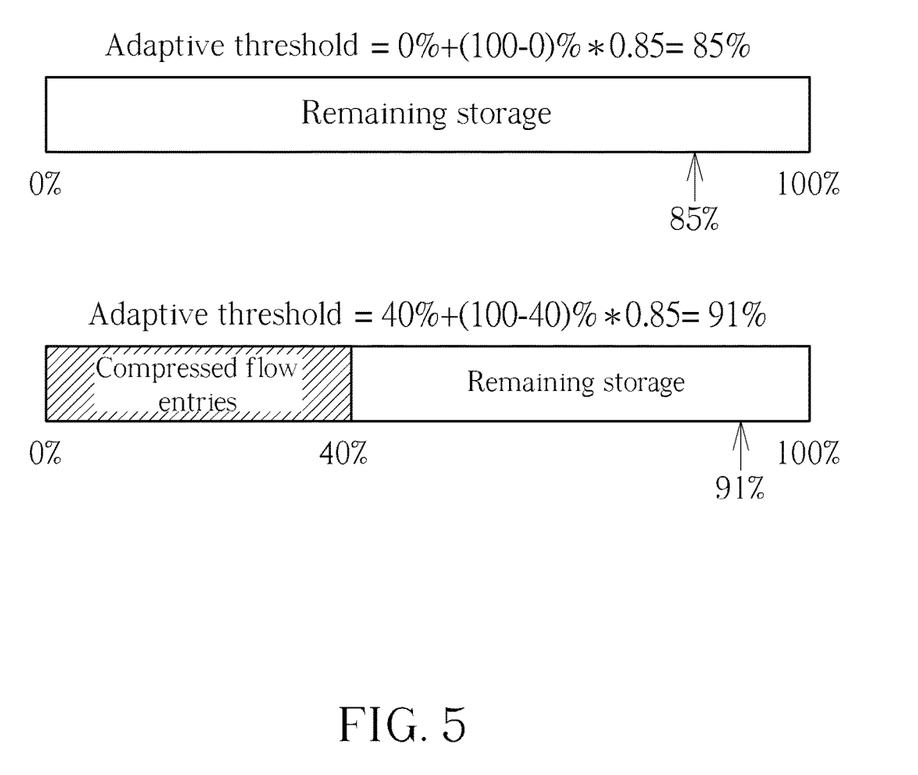
FIG. 5 is a schematic diagram of calculating an adaptive range according to an example of the present invention.

Please refer to FIG. 5, which is a schematic diagram of calculating the adaptive threshold according to an example of the present invention. In the example shown in FIG. 5, the target percentage α of the storage utilized for storing the flow entries in the switching device is 85%. When starting operating, the flow entries stored in the switching device is 0. Under such a condition, the adaptive threshold is 85%. After a period of time, the switching device performs the compression progress at least one time and the storage occupied by the stored flow entries becomes 40% of total storage of the switching device. Under such a condition, the switching device acquires 91% according to the equation (1) as the new adaptive threshold. According to the adjusted adaptive threshold, the switching device continuously monitors the storage occupied by the stored flow entries in the switching device and performs the compression progress when the storage occupied by the stored flow entries exceeds the adaptive threshold. As a result, the ratio between storage occupied by the stored flow entries and the total storage gradually approaches the target percentage α.

To sum up, the examples of the present invention utilize the bit merging and the subset merging to compress the flow entries of the switching device, to reduce the number of the flow entries of the switching device by a fast and concise method. The switching device therefore can prevent the issue of insufficient storage capacity. In addition, the compression rate of the flow entries in the switching device can be improved by adopting the adaptive threshold that varies with the number of the flow entries in the switching device as the reference of performing the compression progress. Also, the switching device avoids performing unnecessary compression progress. The number of times of performing the compression progress can be reduced, therefore.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A flow entry aggregation method of a network system, comprising:
   classifying a plurality of flow entries into a plurality of partitions according to a plurality of indicators of the plurality of flow entries, wherein each flow entry utilizes ternary strings to represent at least one field of the flow entry and the plurality of indicators are utilized to indicating network requirements corresponding to the plurality of flow entries; and
   utilizing bit merging or subset merging to compress the flow entries in the same partition.

2. The flow entry aggregation method of claim 1, wherein the step of utilizing the bit merging to compress the flow entries in the same partition comprises:
   utilizing a substitution symbol to substitute symbols of a position at which symbols are different in a first flow entry and a second flow entry of one of the plurality of partition when the number of symbols of positions at which symbols are different in the first flow entry and the second flow entry, to generate a third flow entry; and
   utilizing the third flow entry to substitute the first flow entry and the second flow entry.

3. The flow entry aggregation method of claim 1, wherein the step of utilizing the subset merging to compress the flow entries in the same partition comprises:
   substituting a first flow entry by a second flow entry of one of the plurality of partition when the first flow entry is a subset of the second flow entry.

4. The flow entry aggregation method of claim 1, wherein the step of classifying the plurality of flow entries into the plurality of partitions according to the plurality of indicators of the plurality of flow entries comprises:
   classifying the plurality of flow entries into the plurality of partitions according to the plurality of indicators of the plurality of flow entries when the number of the plurality of flow entries exceeds an adaptive threshold.

5. The flow entry aggregation method of claim 4, further comprising:
   adjusting the adaptive threshold according to the number of the plurality of flow entries after utilizing the bit merging and the subset merging to compress the flow entries in the same partition.

6. A network system, comprising:
   a plurality of hosts; and
   a plurality of switches, coupled among the plurality of hosts and a core network, wherein each switch stores a plurality of flow entries and each flow entry utilizes ternary strings to represent at least one field of the flow entry;
   wherein a first switch of the plurality of switches classifies the plurality of flow entries store in the first switch into a plurality of partitions according to a plurality of indicators of the plurality of flow entries stored in the first switch and utilizes bit merging or subset merging to compress the flow entries in the same partition of the first switch;

wherein the plurality of indicators are utilized to indicating network requirements corresponding to the plurality of flow entries.

7. The network system of claim 6, wherein the first switch utilizes a substitution symbol to substitute symbols of a position at which symbols are different in a first flow entry and a second flow entry of one of the plurality of partition when the number of symbols of positions at which symbols are different in the first flow entry and the second flow entry, to generate a third flow entry; and utilizes the third flow entry to substitute the first flow entry and the second flow entry.

8. The network system of claim 6, wherein the first switch substitutes a first flow entry by a second flow entry of one of the plurality of partition in the first switch when the first flow entry is a subset of the second flow entry.

9. The network system of claim 6, wherein the first switch classifies the plurality of flow entries stored in the first switch into the plurality of partitions according to the plurality of indicators of the plurality of flow entries and utilizes the bit merging or the subset merging to compress the flow entries in the same partition when the number of the plurality of flow entries stored in the first switch exceeds an adaptive threshold.

10. The network system of claim 6, wherein the first switch adjusts the adaptive threshold according to the number of the plurality flow entries stored in the first switch after utilizing the bit merging and the subset merging to compress the flow entries in the same partition.

* * * * *